United States Patent
Kang et al.

(10) Patent No.: US 8,583,064 B2
(45) Date of Patent: Nov. 12, 2013

(54) RECEIVER FOR ESTIMATING AND COMPENSATING FOR IN-PHASE/QUADRATURE MISMATCH

(75) Inventors: Young Hwan Kang, Anyang-si (KR); Jiyoung Cho, Seoul (KR); Suwon Kang, Guri-si (KR)

(73) Assignee: GCT semiconductor, Inc., San Jose, CA (US)

( * ) Notice: Subject to any disclaimer, the term of this patent is extended or adjusted under 35 U.S.C. 154(b) by 34 days.

(21) Appl. No.: 13/272,779

(22) Filed: Oct. 13, 2011

(65) Prior Publication Data

US 2012/0270516 A1 Oct. 25, 2012

(30) Foreign Application Priority Data

Oct. 13, 2010 (KR) .......................... 10-2010-0099729

(51) Int. Cl.
*H04B 1/04* (2006.01)

(52) U.S. Cl.
USPC ........... 455/130; 455/131; 455/136; 455/138; 455/240.1

(58) Field of Classification Search
USPC ......... 455/130, 131, 136, 138, 205, 207, 209, 455/232.1, 234.1, 240.1, 245.1, 250.1
See application file for complete search history.

(56) References Cited

U.S. PATENT DOCUMENTS

2011/0013724 A1*   1/2011   Metreaud et al. ............. 375/296

FOREIGN PATENT DOCUMENTS

| JP | 2008-017145 A | 1/2008 |
| JP | 2008-167057 A | 7/2008 |
| JP | 2008-211619 A | 9/2008 |
| JP | 2010-503270 A | 1/2010 |
| KR | 10-20030088813 A | 11/2003 |
| KR | 10-2005-0098496 A | 10/2005 |

OTHER PUBLICATIONS

Office Action from Japanese Patent Office dated Mar. 25, 2013.

* cited by examiner

*Primary Examiner* — Tuan Pham
(74) *Attorney, Agent, or Firm* — Muir Patent Consulting, PLLC

(57) ABSTRACT

A receiver includes a first mixer configured to provide an in-phase (I) component of a radio frequency (RF) signal to an I channel by down-converting the RF signal, a second mixer configured to provide a quadrature (Q) component of the RF signal to a Q channel by down-converting the RF signal, amplification means, arranged on the I and Q channels, configured to amplify the I and Q components, a mismatch estimator configured to convert the amplified I and Q components into a frequency domain, and estimate a gain mismatch value and a phase mismatch value on the basis of the converted components, and a mismatch compensator configured to compensate for mismatch of the received signal on the basis of the estimated gain and phase mismatch values.

21 Claims, 10 Drawing Sheets

RECEIVER FOR ESTIMATING AND COMPENSATING FOR IN-PHASE/QUADRATURE MISMATCH

CROSS-REFERENCE TO RELATED APPLICATION

This application claims priority to and the benefit of Korean Patent Application No. 10-2010-0099729, filed on Oct. 13, 2010, the disclosure of which is incorporated herein by reference in its entirety.

BACKGROUND

1. Field of the Invention

The present invention relates to a radio receiver for estimating and compensating for in-phase/quadrature (IQ) mismatch.

2. Discussion of Related Art

In recent communication systems, a direct conversion reception method capable of reducing the number of components and having low complexity and low power consumption has been preferred. The direct conversion reception method converts a signal of a radio frequency (RF) band into a baseband by use of one mixer without involving an intermediate frequency. The mixer receives the RF signal and outputs signals of an in-phase (I) component and a quadrature (Q) component. Each signal is input to an analog-to-digital (A/D) converter through an amplifier and an analog filter. In this process, mismatch occurs in the signals of the I and Q components due to an analog circuit including a local oscillator, a mixer, an amplifier, and an analog filter. This mismatch reduces a signal to noise ratio of a received signal, thereby increasing a bit error rate (BER) and degrading the performance of a wireless communication receiver. To reduce the mismatch, errors of the I and Q components should be minimized when the analog circuit is designed. Also, when the analog circuit is designed, more precision is required and cost of the analog circuit increases.

To avoid these disadvantages, methods of estimating and compensating for the mismatch in a digital stage have been proposed. For example, there is a method using a pilot signal in an orthogonal frequency division multiplexing (OFDM) system or a method using a known signal in a system including a transmitter and a receiver. The method of estimating the mismatch by use of a specific pilot signal in a system supporting the OFDM scheme cannot be applied to a system with no pilot signal. There is a disadvantage in that the performance of estimating the mismatch is degraded due to a pilot signal estimation error. In the method proposed in a transceiver structure including both of the transmitter and the receiver, mismatch of the receiver is estimated by generating a specific signal through the transmitter and receiving the specific signal by the receiver in an RF stage. This method additionally requires a signal generator in a system only having a receiver such as a mobile broadcast receiver, and has a disadvantage in that the mismatch is not compensated for in real time during communication. Mismatch compensation methods proposed in the related art have a disadvantage in that time mismatch occurring due to a group delay difference of an analog filter between I and Q components or a circuit length difference in a broadband system having a high sampling frequency is not processed.

SUMMARY OF THE INVENTION

The disclosed technology is directed to a receiver capable of estimating and compensating for IQ mismatch using an unknown received signal. For example, the unknown received signal may be a general data signal rather than a pilot signal.

The disclosed technology is directed to a receiver capable of estimating and compensating for mismatch of the receiver, regardless of a type of modulation signal, and estimating and compensating for mismatch of a received signal while the signal is received.

The disclosed technology is also directed to a receiver capable of effectively estimating and compensating for mismatch when there is a time delay between I and Q components in a receiver having a high sampling frequency such as a broadband system by estimating mismatch using some bands of a received signal.

According to a first aspect of the disclosed technology, there is provided a receiver including: a first mixer configured to provide an I component of an RF signal to an I channel by down-converting the RF signal; a second mixer configured to provide a Q component of the RF signal to a Q channel by down-converting the RF signal; amplification means, arranged on the I and Q channels, configured to amplify the I and Q components; a mismatch estimator configured to convert the amplified I and Q components into a frequency domain, and estimate a gain mismatch value and a phase mismatch value on the basis of the converted components; and a mismatch compensator configured to compensate for mismatch of the received signal on the basis of the estimated gain and phase mismatch values.

According to a second aspect of the disclosed technology, there is provided a receiver using a direct conversion method, including: a mismatch estimator configured to transform signals including I and Q components of a received signal into frequency domain values, and estimate a gain mismatch value and a phase mismatch value on the basis of the frequency domain values; and a mismatch compensator configured to compensate for gain mismatch and phase mismatch of the received signal on the basis of the estimated gain and phase mismatch values.

According to a third aspect of the disclosed technology, there is provided a receiver using a direct conversion method, including: a mismatch compensator configured to compensate for gain mismatch and phase mismatch of a received signal; a mismatch estimator configured to transform signals including I and Q components of the received signal for which the gain mismatch and the phase mismatch have been compensated into frequency domain values, and estimate a gain mismatch value and a phase mismatch value on the basis of the frequency domain values; and a loop filter configured to filter the estimated gain and phase mismatch values and feed back the filtered values to the mismatch compensator.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the disclosed technology are disclosed herein. However, specific structural and functional details disclosed herein are merely representative for purposes of describing exemplary embodiments of the disclosed technology, however, exemplary embodiments of the disclosed technology may be embodied in many alternate forms and should not be construed as limited to exemplary embodiments of the disclosed technology set forth herein.

The terminology used herein is for the purpose of describing particular embodiments only and is not intended to be limiting of the invention.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless the context clearly indicates a specific order, steps may occur out of the noted order. That is, the steps may be executed in the same order as noted, the steps may be executed substantially concurrently, or the steps may be executed in the reverse order.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
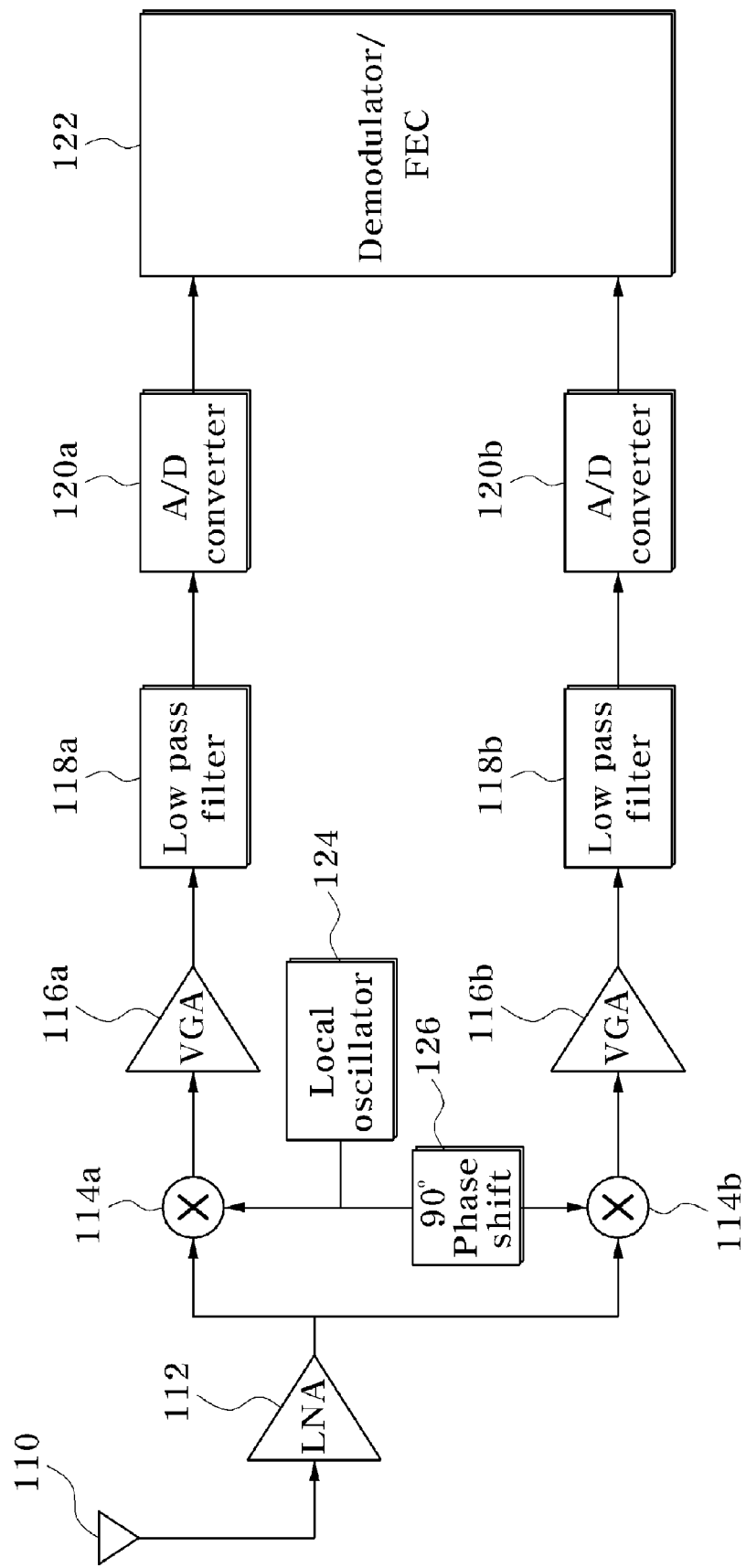
FIG. 1 is a diagram illustrating a general structure of a receiver using a direct conversion reception method.

FIG. 1 is a diagram illustrating a general structure of a receiver using a direct conversion reception method.

Referring to FIG. 1, a signal received by an antenna 110 is input to mixers 114a and 114b through a low noise amplifier (LNA) 112. The mixers 114a and 114b divide the input signal into I and Q components, and down-convert the I and Q components into baseband signals. The signals after the down-conversions are input to A/D converters 120a and 120b through variable gain amplifiers (VGAs) 116a and 116b and low pass filters 118a and 118b. After digital conversion, the signals are transferred to a demodulator 122. A signal output from a local oscillator 124 is input to the I component mixer 114a and a phase shifter 126. The phase shifter 126 shifts a phase of the input signal by 90 degrees and provides the phase-shifted signal to the Q component mixer 114b. Here, a phase difference between the signal input to the I component mixer 114a and the signal input to the Q component mixer 114b should be ideally 90 degrees. However, if the phase difference is not 90 degrees, phase mismatch occurs. Outputs of the mixers 114a and 114b pass through the VGAs 116a and 116b and the low pass filters 118a and 118b. If there is a signal amplification gain difference between two circuits, gain mismatch occurs.

Figure 2:
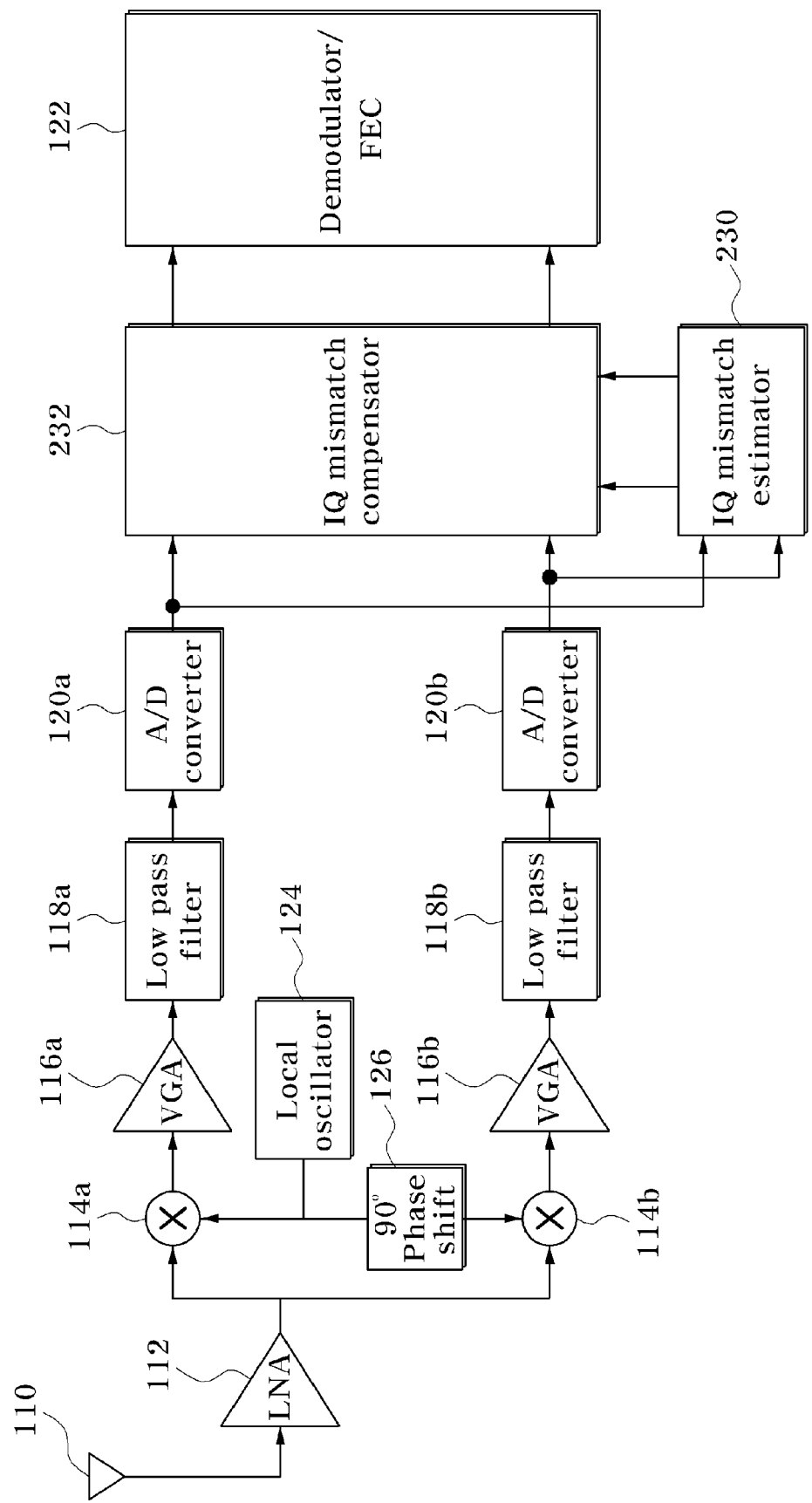
FIG. 2 is a block diagram showing a receiver according to an exemplary embodiment of the disclosed technology.

FIG. 2 is a block diagram showing a receiver according to an exemplary embodiment of the disclosed technology. As compared to the receiver of FIG. 1, the receiver of FIG. 2 further includes an IQ mismatch estimator 230 and an IQ mismatch compensator 232.

The IQ mismatch estimator 230 receives digital signals from the A/D converters 120a and 120b, and estimates IQ mismatch values from the digital signals. Here, the IQ mismatch values include a phase mismatch value and a gain mismatch value.

The IQ mismatch compensator 232 compensates for IQ mismatch of digital signals received from the A/D converters 120a and 120b on the basis of the estimated IQ mismatch values, and transfers IQ mismatch-compensated signals to a demodulator 122.

Figure 3:
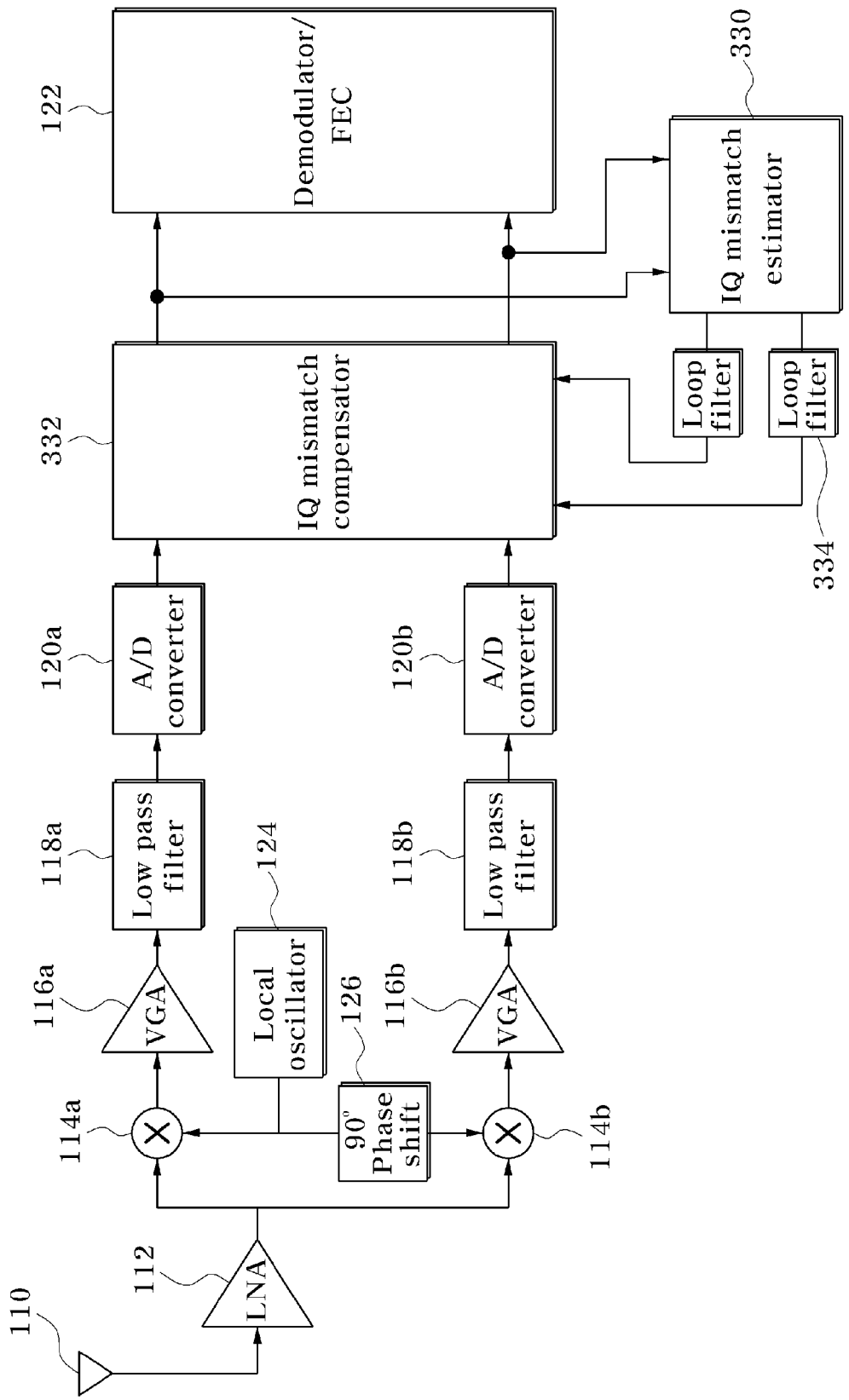
FIG. 3 is a block diagram showing a receiver according to another exemplary embodiment of the disclosed technology.

FIG. 3 is a block diagram showing a receiver according to another exemplary embodiment of the disclosed technology. As compared to the receiver of FIG. 1, the receiver of FIG. 3 further includes an IQ mismatch estimator 330, an IQ mismatch compensator 332, and a loop filter 334.

The IQ mismatch estimator 330 estimates IQ mismatch values from signals passing through the IQ mismatch compensator 332, and outputs the estimated IQ mismatch values to the IQ mismatch compensator 332.

The IQ mismatch compensator 332 compensates for IQ mismatch of the digital signals received from the A/D converters 120a and 120b on the basis of the estimated IQ mismatch values, and transfers the IQ mismatch-compensated signals to the demodulator 122. For stable convergence, the loop filter 334 is inserted between the IQ mismatch estimator 330 and the IQ mismatch compensator 332.

Figure 4:
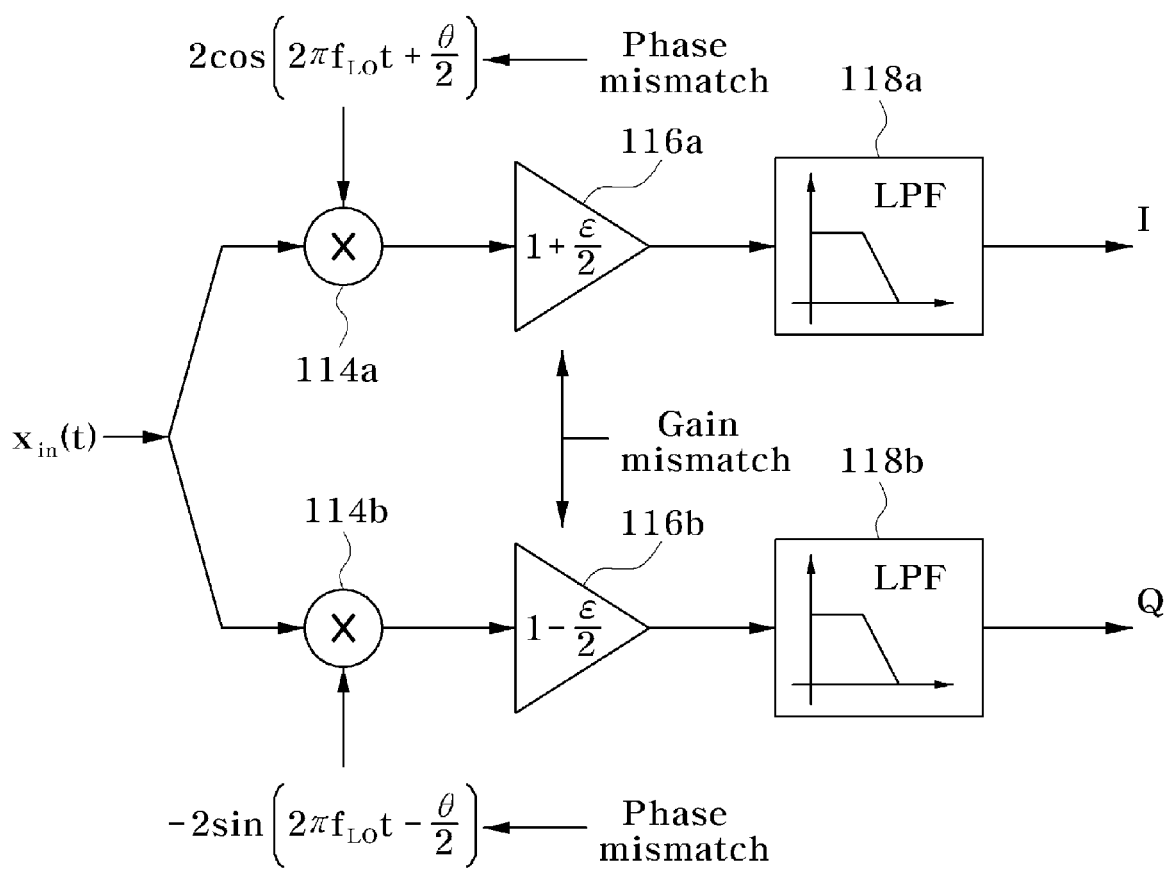
FIG. 4 is a diagram showing mathematical modeling of distortion of a signal input to an A/D converter when phase mismatch and gain mismatch occur in the receiver of FIGS. 2 and 3.

FIG. 4 is a diagram showing mathematical modeling of distortion of a signal input to the A/D converter when phase mismatch and gain mismatch occur in the receiver of FIGS. 2 and 3.

In FIG. 4, $x_{in}(t)$ corresponds to a signal input to the mixers 114a and 114b through the antenna 110 and the LNA 112, and $2\cos(2\pi f_{LO}t+\theta/2)$ and $-2\sin(2\pi f_{LO}t-\theta/2)$ correspond to signals input to the mixers 114a and 114b for the I and Q components as an output of the local oscillator 124. $f_{LO}$ corresponds to a frequency of the local oscillator 124, and corresponds to a center frequency of a transmitted signal in a structure based on the direct conversion method. $\theta$ corresponds to a phase mismatch value between the I and Q components, and E corresponds to a gain mismatch value between the I and Q components. Here, when a transmitted signal, which is a baseband signal transmitted from a transmission stage, is $x_{BB}(t)=a(t)+jb(t)$, a signal $x_{in}(t)$ input to the mixers 114a and 114b is $x_{in}(t)=a(t)\cos(2\pi ft)-b(t)\sin(2\pi ft)$.

When there is IQ mismatch, the following Equation (1) is given if signals I and Q output through the mixers 114a and 114b, the VGAs 116a and 116b, and the low pass filters 118a and 118b are expressed as a(t) and b(t), which are I and Q components of the transmitted signal.

$$\begin{bmatrix} I \\ Q \end{bmatrix} = \begin{bmatrix} (1+\frac{\varepsilon}{2})\cos\frac{\theta}{2} & (1+\frac{\varepsilon}{2})\sin\frac{\theta}{2} \\ (1-\frac{\varepsilon}{2})\sin\frac{\theta}{2} & (1-\frac{\varepsilon}{2})\cos\frac{\theta}{2} \end{bmatrix} \cdot \begin{bmatrix} a(t) \\ b(t) \end{bmatrix} = M \cdot \begin{bmatrix} a(t) \\ b(t) \end{bmatrix} \quad (1)$$

Accordingly, an inverse matrix of a mismatch matrix M should be multiplied by $$\begin{bmatrix} I \\ Q \end{bmatrix}$$

so as to recover a transmitted signal $x_{BB}(t)$ from the signals I and Q. The inverse matrix of M is defined as the following Equation (2).

$$M^{-1} = \begin{bmatrix} (1+\frac{\varepsilon}{2})\cos\frac{\theta}{2} & (1+\frac{\varepsilon}{2})\sin\frac{\theta}{2} \\ (-\frac{\varepsilon}{2})\sin\frac{\theta}{2} & (1-\frac{\varepsilon}{2})\cos\frac{\theta}{2} \end{bmatrix}^{-1} = A \cdot \begin{bmatrix} 1 & \gamma \cdot \tan\omega \\ \tan\omega & \gamma \end{bmatrix} \quad (2)$$

Here, $w=-\theta/2$, $\gamma=(2+\varepsilon)/(2-\varepsilon)$, and $A=(\cos\theta)/\{(1+\varepsilon)\cos\theta\}$.

Figure 5:
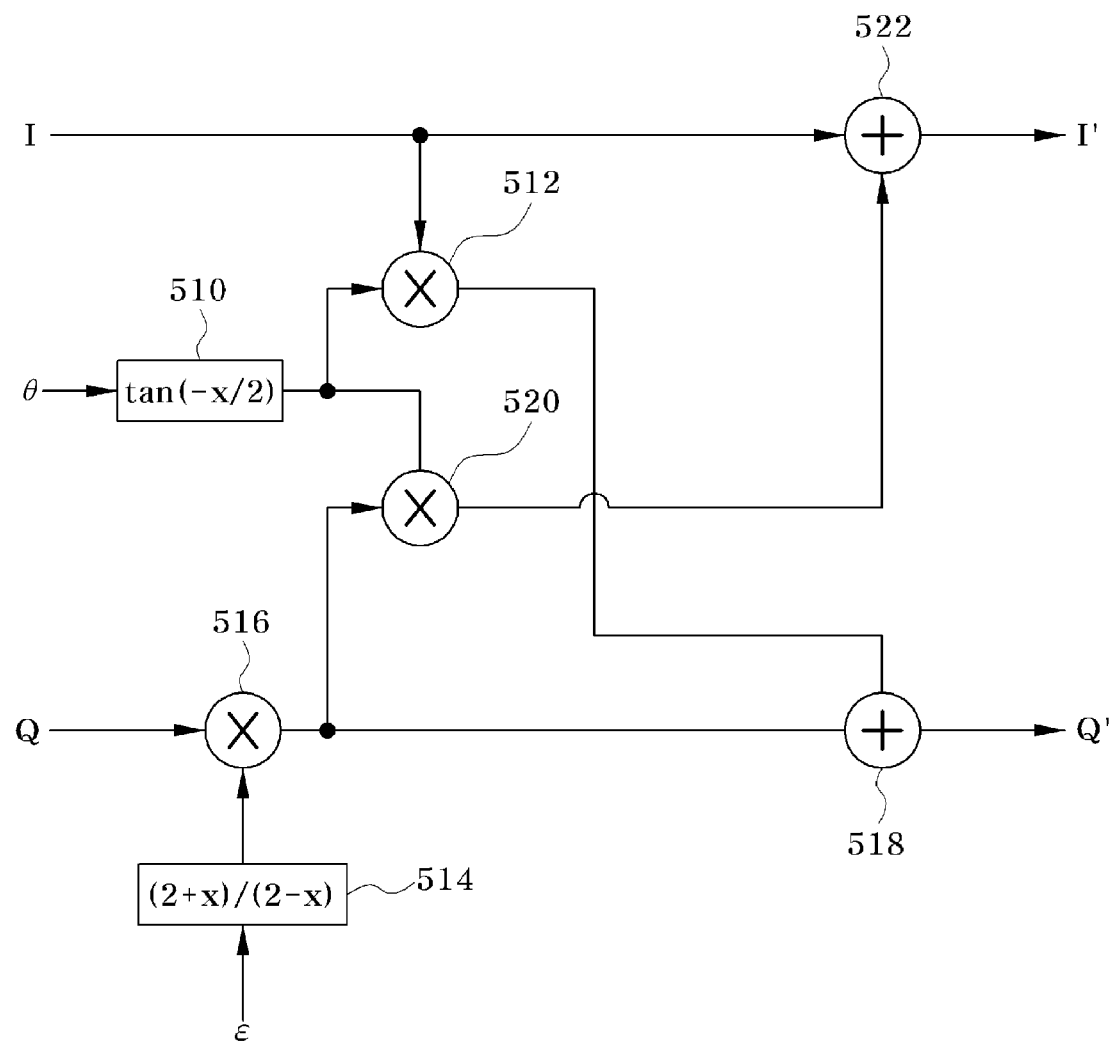
FIG. 5 is a diagram showing an IQ mismatch compensator of FIGS. 2 and 3.

FIG. 5 is a diagram showing the IQ mismatch compensator of FIGS. 2 and 3.

The IQ mismatch compensator of FIG. 5 corresponds to a circuit implemented for the inverse matrix of the mismatch matrix M shown in Equation (2). In Equation (2), A is a scale common between the I and Q components, and may be omitted if its value is close to 1. Therefore, when the phase mismatch value $\theta$ and the gain mismatch value $\varepsilon$ can be estimated, it is possible to remove the IQ mismatch on the basis of the circuit shown in FIG. 5.

Referring to FIG. 5, the IQ mismatch compensator includes a first operator 510, a second operator 514, multipliers 512, 516, and 520, and adders 518 and 522.

The first operator 510 carries out a $\tan(-\theta)$ operation from the phase mismatch value $\theta$, and outputs a phase mismatch compensation value to the first multiplier 512 and the third multiplier 520. The first multiplier 512 multiplies an output of the first operator 510 by an I component of the received signal, and outputs a result of multiplication to the first adder 518. The second operator 514 carries out an operation of $(2+\varepsilon)/(2-\varepsilon)$ from the gain mismatch value $\varepsilon$, and outputs a gain mismatch compensation value to the second multiplier 516. The second multiplier 516 multiplies an output of the second operator 514 by a Q component of the received signal, and outputs a result of multiplication to the first adder 518 and the third multiplier 520. The first adder 518 adds an output of the second multiplier 516 to an output of the first multiplier 512, and outputs a mismatch-compensated Q component. The third multiplier 520 multiplies the output of the second multiplier 516 by the output of the first operator 510, and outputs a result of multiplication to the second adder 522. The second adder 522 adds an output of the third multiplier 520 to the I component of the received signal, and outputs a mismatch-compensated I component.

The IQ mismatch estimator of FIGS. 2 and 3 can estimate IQ mismatch according to the following method.

First, if a signal input to the mixers 114a and 114b corresponds to a tone signal having a single frequency, the IQ mismatch can be calculated through the following method. A transmitted signal $x_{BB}(t)$, which is a baseband signal, corresponds to the following Equation (3).

$$X_{BB}(t)=a(t)+jb(t)=Xe^{j(2\pi f_\tau t+\phi)}=X(\cos(2\pi f_\tau t+\phi)+j\sin(2\pi f_\tau t+\phi)) \quad (3)$$

The transmitted signal $x_{BB}(t)$ is distorted by mismatch characteristics of the receiver, and input to the A/D converters 120a and 120b. Therefore, if a signal $r_{BB}(t)$ input to the A/D converters 120a and 120b is derived using Equation (1), the following Equation (4) is given.

$$r_{BB}(t) = I + jQ = \quad (4)$$
$$\left(\cos\frac{\theta}{2} - j\frac{\varepsilon}{2}\sin\frac{\theta}{2}\right)e^{j\varphi}Xe^{j(2\pi f_\tau t)} + \left(\frac{\varepsilon}{2}\cos\frac{\theta}{2} + j\sin\frac{\theta}{2}\right)e^{-j\varphi}Xe^{-j(2\pi f_\tau t)}$$

Here, a tone frequency $f_\tau$ is an integer multiple of an inter-carrier frequency $\Delta f$ of a fast Fourier transform (FFT), and is $f_\tau = \tau \cdot \Delta f$ if the integer multiple is $\tau$. If $r_{BB}(t)$ is transformed by the FFT, a $\tau$-th index and a $-\tau$-th index respectively have values corresponding to the following Equations (5) and (6) on the basis of a DC carrier index value "0."

$$R[\tau] = X\left(\cos\frac{\theta}{2} - j\frac{\varepsilon}{2}\sin\frac{\theta}{2}\right)e^{j\varphi} \quad (5)$$

$$R[-\tau] = X\left(\frac{\varepsilon}{2}\cos\frac{\theta}{2} + j\sin\frac{\theta}{2}\right)e^{-j\varphi} \quad (6)$$

The following Equation (7) can be derived from Equations (5) and (6).

$$R[-\tau] \cdot R[\tau] = X^2\left(\frac{\varepsilon}{2} + \left(1 - \frac{\varepsilon^2}{4}\right)j\frac{\sin\theta}{2}\right) \quad (7)$$

If Equation (7) is rewritten for the gain mismatch value $\varepsilon$, the gain Mismatch value can be derived as shown in the following Equation (8).

$$\varepsilon = \frac{2}{X^2}\text{Re}\{R[\tau] \cdot R[-\tau]\} \quad (8)$$

A phase mismatch value $\theta$ as shown in the following Equation (9) can be derived from the gain mismatch value $\varepsilon$ derived by Equation (8).

$$\theta = \sin^{-1}\left(\frac{2}{X^2} \cdot \left(\frac{1}{1-\frac{\varepsilon^2}{4}}\right) \cdot \text{Im}\{R[\tau] \cdot R[-\tau]\}\right) \quad (9)$$

Here, if the magnitude of the phase mismatch value is small, the phase mismatch value of Equation (9) can be approximated as shown in the following Equation (10).

$$\theta \approx \frac{2}{X^2}\text{Im}\{R[\tau] \cdot R[-\tau]\} \quad (10)$$

Accordingly, when a tone signal having a single frequency is received, the received signal is transformed by the FFT. A mismatch value according to Equations (8) to (10) can be calculated from an FFT value, and mismatch can be eliminated using the calculated mismatch value.

Next, if signals input to the mixers 114a and 114b correspond to arbitrary modulation signals, not single frequencies, the signals input to the mixers 114a and 114b are transformed by the FFT. The following Equation (11) can be derived by extending and rewriting Equations (5) to (7).

$$\sum_{\tau=1}^{\frac{N}{2}-1} R[-\tau] \cdot R[\tau] \approx \left(\frac{\varepsilon}{2} + \left(1 - \frac{\varepsilon^2}{4}\right) j \frac{\sin\theta}{2}\right) \cdot \sum_{\tau=1}^{\frac{N}{2}-1} (|r_\tau|^2 + |r_{-\tau}|^2) \quad (11)$$

Here, N is the total number of carriers, and $r_\tau$ is a value output in a τ-th carrier position after the FFT and is independent according to each carrier. A sum of powers of all carrier signals on a frequency axis corresponds to a power value of the received signal. Accordingly, the following Equations (12) and (13) can be derived from Equation (11) if $$\sum_{\tau=1}^{\frac{N}{2}-1} (|r_\tau|^2 + |r_{-\tau}|^2) = P \quad (12)$$

$$\varepsilon = \frac{2}{P} \text{Re}\left\{\sum_{\tau=1}^{\frac{N}{2}-1} R[-\tau] \cdot R[\tau]\right\}$$

$$\theta = \sin^{-1}\left(\frac{2}{P} \cdot \left(\frac{1}{1 - \frac{\varepsilon^2}{4}}\right) \cdot \text{Im}\left\{\sum_{\tau=1}^{\frac{N}{2}-1} R[-\tau] \cdot R[\tau]\right\}\right) \quad (13)$$

If the magnitude of the phase mismatch value is small, the phase mismatch value of Equation (13) can be approximated as shown in the following Equation (14).

$$\theta \approx \frac{2}{P} \cdot \text{Im}\left\{\sum_{\tau=1}^{\frac{N}{2}-1} R[-\tau] \cdot R[\tau]\right\} \quad (14)$$

Accordingly, when an arbitrary modulation signal is received, the received signal is transformed by the FFT. A mismatch value according to Equations (12) to (14) can be calculated from an FFT value, and mismatch can be eliminated using the calculated mismatch value.

Figure 6:
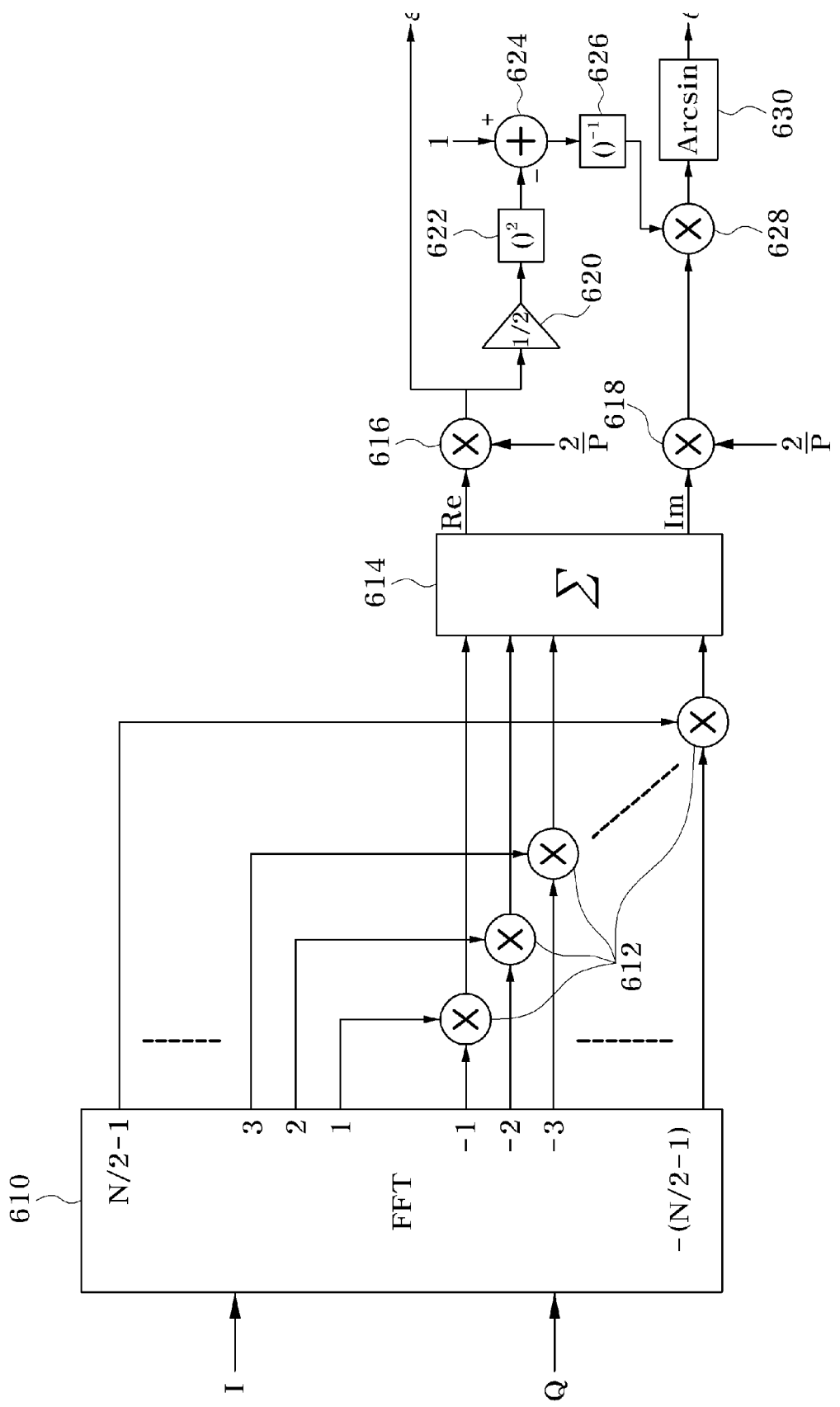
FIG. 6 is a circuit diagram showing an example of an IQ mismatch estimator of FIGS. 2 and 3.
Figure 7:
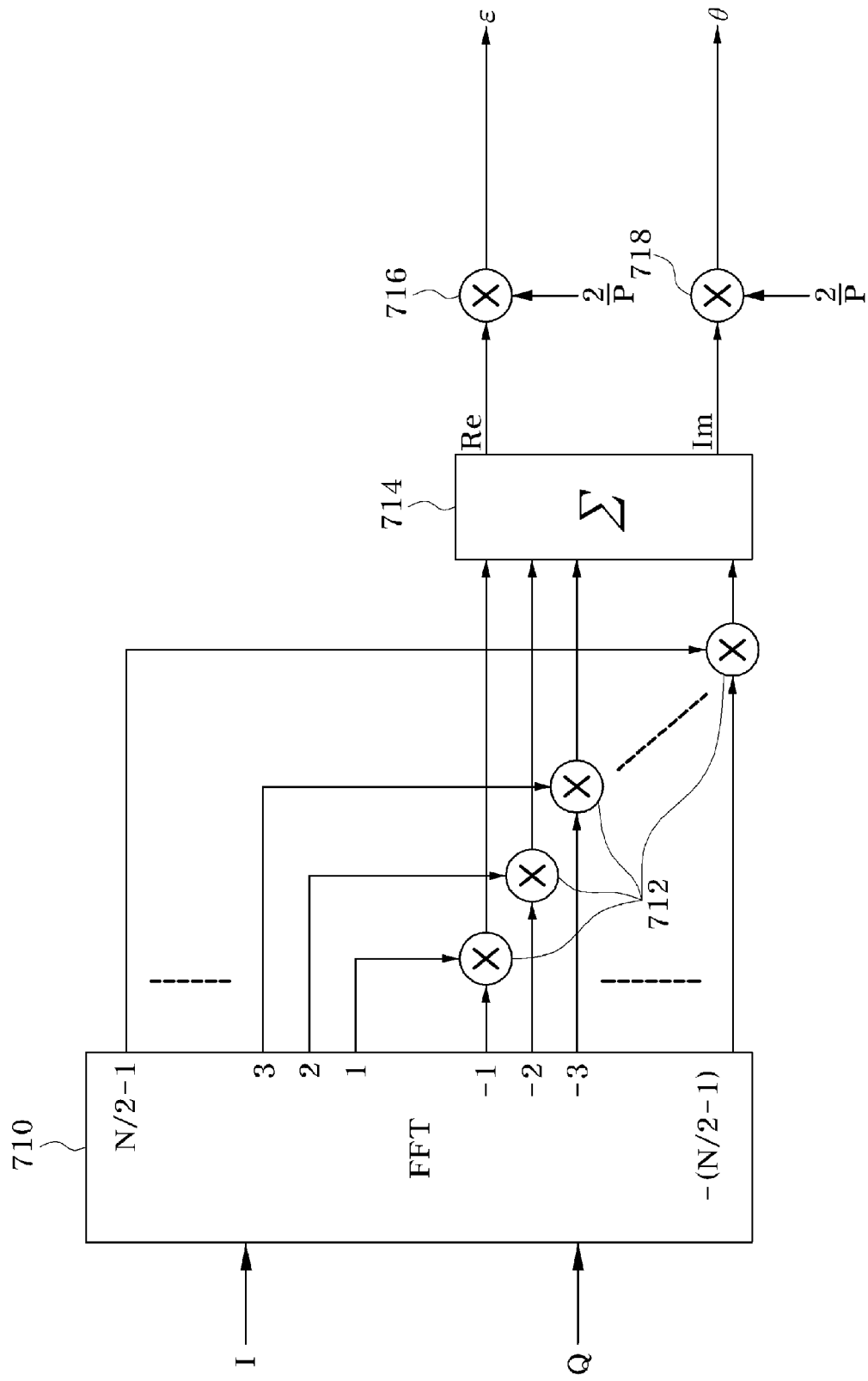
FIG. 7 is a circuit diagram showing another example of the IQ mismatch estimator of FIGS. 2 and 3.

FIG. 6 is a circuit diagram showing an example of the IQ mismatch estimator of FIGS. 2 and 3, and FIG. 7 is a circuit diagram showing another example of the IQ mismatch estimator of FIGS. 2 and 3. The IQ mismatch estimator of FIG. 6 corresponds to a circuit implemented from Equations (12) and (13), and the IQ mismatch estimator of FIG. 7 corresponds to a circuit implemented from Equations (12) and (14).

The IQ mismatch estimator of FIG. 6 transforms signals input from the A/D converters 120a and 120b by the FFT, and calculates a sum of all output values after multiplying two output values positioned symmetrically with respect to a direct current (DC) component. The IQ mismatch estimator can derive the gain mismatch value ε by multiplying a real part of the sum value by 2/P, and derive the phase mismatch value θ by carrying out a $\sin^{-1}$ operation after multiplying an imaginary part of the sum value by $$\frac{2}{P} \cdot \left(\frac{1}{1 - \frac{\varepsilon^2}{4}}\right) \cdot \sin^{-1}$$

$\sin^{-1}$ corresponds to a non-linear function. When the non-linear function is actually implemented, complexity may be increased. Because a mismatch value to be compensated for is generally small, the IQ mismatch estimator can be implemented as shown in FIG. 7 according to Equation (14) instead of Equation (13).

Referring to FIG. 6, the IQ mismatch estimator includes an FFT unit 610, first multipliers 612, a summer 614, a second multiplier 616, a third multiplier 618, an amplifier 620, a squarer 622, a subtractor 624, a reciprocal output unit 626, a fourth multiplier 628, and an arcsin operator 630.

The FFT unit 610 transforms signals including I and Q components of a received signal into frequency domain values. The first multipliers 612 multiply transformed values by values positioned symmetrically with respect to a DC component. The summer 614 produces a sum of outputs of the first multipliers 612. The second multiplier 616 multiplies a real part of an output of the summer 614 by a preset value, thereby deriving a gain mismatch value. The third multiplier 618 multiplies an imaginary part of the output of the summer 614 by a preset value. The amplifier 620 reduces the derived gain mismatch value by ½. The squarer 622 squares an output of the amplifier 620. The subtractor 624 subtracts an output of the squarer 622 from a constant "1." The reciprocal output unit 626 outputs a reciprocal of an output of the subtractor 624. The fourth multiplier 628 multiplies an output of the reciprocal output unit 626 by an output of the third multiplier 618. The arcsin operator 630 derives a phase mismatch value by carrying out an arcsin operation on an output of the fourth multiplier 628.

Referring to FIG. 7, the IQ mismatch estimator includes an FFT unit 710, first multipliers 712, a summer 714, a second multiplier 716, and a third multiplier 718.

The FFT unit 710 transforms signals including I and Q components of a received signal into frequency domain values. The first multipliers 712 multiply the frequency domain values by values positioned symmetrically with respect to a DC component. The summer 714 produces a sum of outputs of the first multipliers 712. The second multiplier 716 derives a gain mismatch value by multiplying a real part of an output of the summer 714 by a preset value. The third multiplier 718 multiplies an imaginary part of the output of the summer 714 by a preset value. Although a mismatch is derived using signals of all bands as described above, a mismatch may be derived using only some bands, rather than all of the bands. In this case, Equations (12), (13), and (14) may be respectively modified to the following Equations (15), (16), and (17).

$$\varepsilon = \frac{2}{P_l} \text{Re}\left\{\sum_{\tau=a}^{b} R[-\tau] \cdot R[\tau]\right\} \quad (15)$$

$$\theta = \sin^{-1}\left(\frac{2}{P_l} \cdot \left(\frac{1}{1 - \frac{\varepsilon^2}{4}}\right) \cdot \text{Im}\left\{\sum_{\tau=a}^{b} R[-\tau] \cdot R[\tau]\right\}\right) \quad (16)$$

$$\theta \approx \frac{2}{P_l} \cdot \text{Im}\left\{\sum_{\tau=a}^{b} R[-\tau] \cdot R[\tau]\right\} \quad (17)$$

Here, P' corresponds to the following Equation (18).

$$P' = \sum_{\tau=a}^{b} (|r_\tau|^2 + |r_{-\tau}|^2) \quad (18)$$

Figure 8:
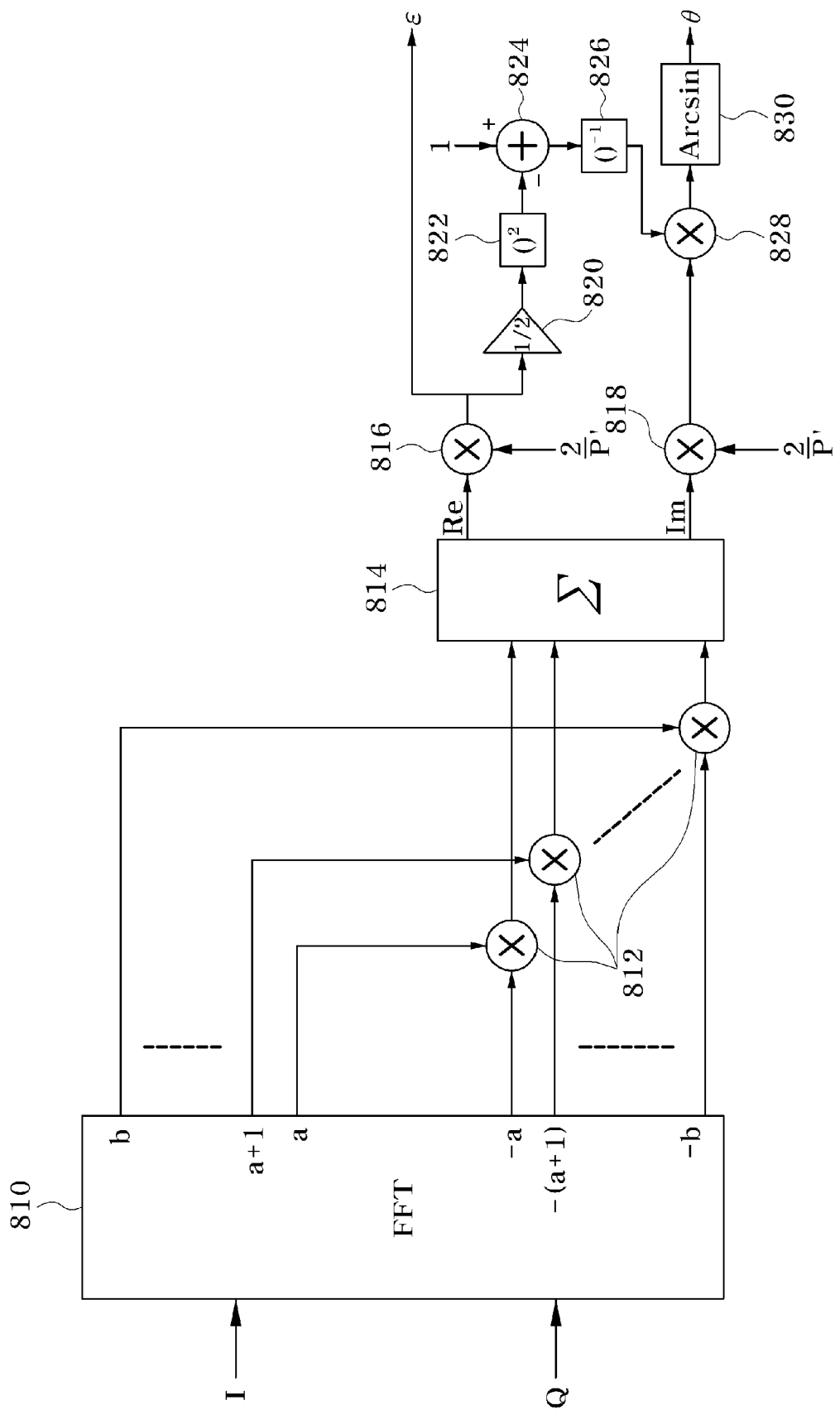
FIG. 8 is a circuit diagram showing another example of the IQ mismatch estimator of FIGS. 2 and 3.
Figure 9:
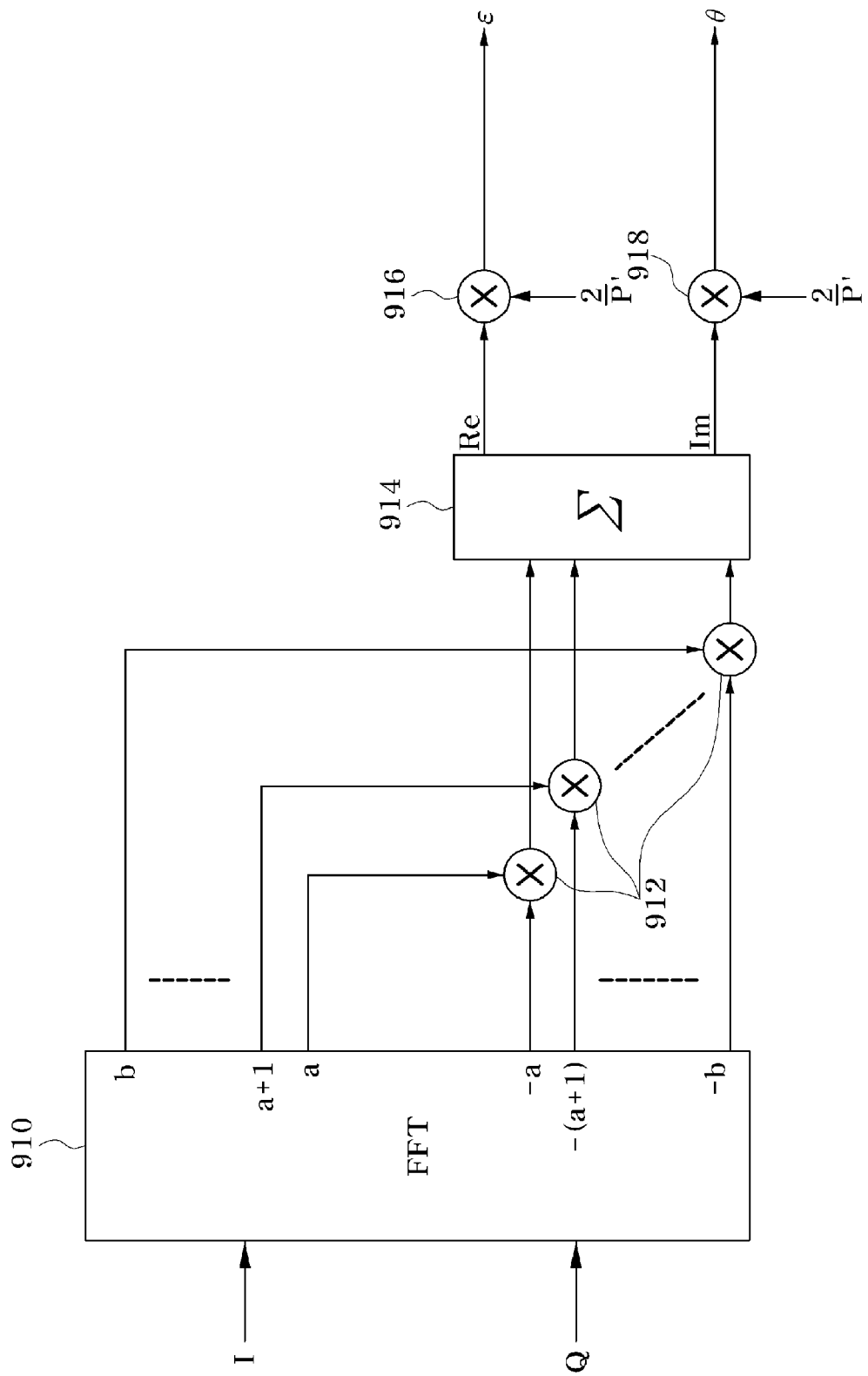
FIG. 9 is a circuit diagram showing another example of the IQ mismatch estimator of FIGS. 2 and 3.

FIG. 8 is a circuit diagram showing another example of the IQ mismatch estimator of FIGS. 2 and 3, and FIG. 9 is a circuit diagram showing another example of the IQ mismatch estimator of FIGS. 2 and 3. The IQ mismatch estimator of FIG. 8 is a circuit diagram corresponding to Equations (15) and (16), and the IQ mismatch estimator of FIG. 9 is a circuit diagram corresponding to Equations (15) and (17). The IQ mismatch estimators according to FIGS. 8 and 9 estimate mismatch by use of some bands.

Referring to FIG. 8, the IQ mismatch estimator includes an FFT unit 810, first multipliers 812, a summer 814, a second multiplier 816, a third multiplier 818, an amplifier 820, a squarer 822, a subtractor 824, a reciprocal output unit 826, a fourth multiplier 828, and an arcsin operator 830. As compared to the IQ mismatch estimator of FIG. 6, the IQ mismatch estimator of FIG. 8 is different in that the first multipliers 912 multiply values corresponding to some bands by values positioned symmetrically with respect to a DC component, and output multiplication results to the summer 814. The other components are the same as in FIG. 6.

Referring to FIG. 9, the IQ mismatch estimator includes an FFT unit 910, the first multipliers 912, a summer 914, a second multiplier 916, and a third multiplier 918. As compared to the IQ mismatch estimator of FIG. 7, the IQ mismatch estimator of FIG. 9 has a difference in that the first multipliers 812 multiply values corresponding to some bands by values positioned symmetrically with respect to a DC component, and output multiplication results to the summer 914. The other components are the same as in FIG. 7.

Because a sampling frequency is high in a broadband communication system, there may be a time delay between I and Q components. Here, in the time delay, a time difference may occur due to a group delay difference while signals pass through analog circuits in paths of the I and Q components, and a time difference between the I and Q components may occur due to sampling timings of the A/D converters 120a and 120b. The time difference may lead to an error in phase mismatch estimation. Because distortion by the time difference is not observed in a low frequency domain, it is possible to estimate mismatch by use of a signal of a low frequency band. The circuits of FIGS. 8 and 9 estimate mismatch by use of some bands of a signal, for example, a low band in a broadband system.

Figure 10:
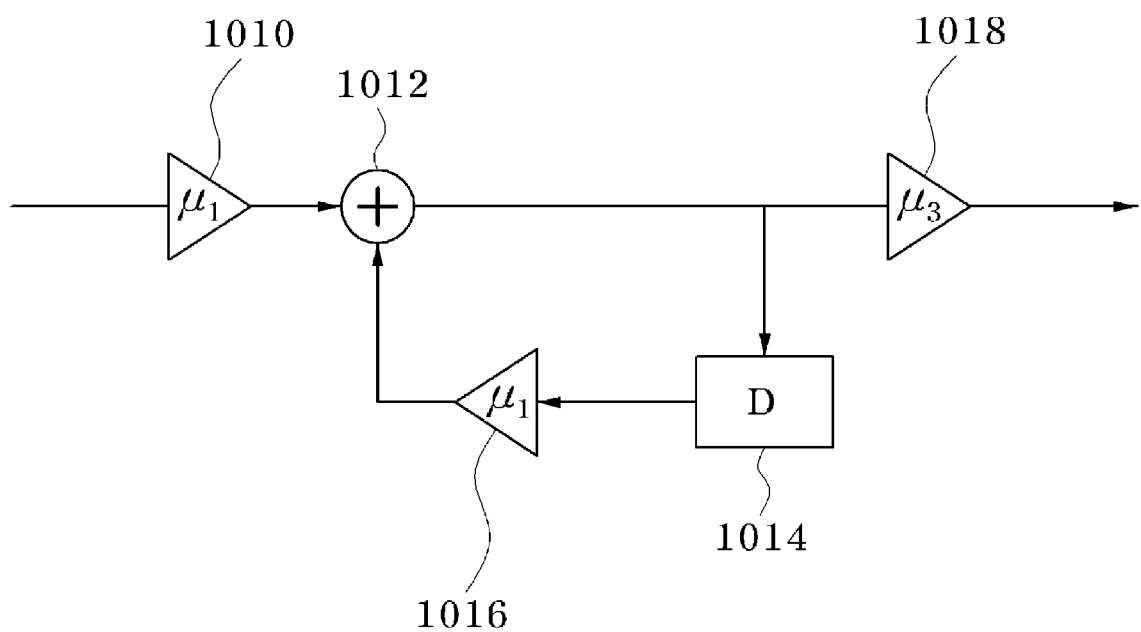
FIG. 10 is a circuit diagram showing a loop filter of FIGS. 2 and 3.

FIG. 10 is a circuit diagram showing the loop filter of the FIG. 3. Referring to FIG. 10, the loop filter includes a first amplifier 1010, an adder 1012, a memory 1014, a second amplifier 1016, and a third amplifier 1018. After a value obtained by multiplying an input signal by a gain of µ1 is added to a value obtained by multiplying a value stored in the memory by a gain of µ2, a value of an addition result is multiplied by µ3 and a result of multiplication is output.

The exemplary embodiments of the present disclosure have the following advantages. However, since this does not mean that all the exemplary embodiments of the present disclosure include the advantages, the scope of the present disclosure is not limited to the advantages.

According to an exemplary embodiment, a receiver can estimate and compensate for mismatch of the receiver, regardless of a type of modulation signal, and estimate and compensate for mismatch of a received signal while the signal is received.

According to an exemplary embodiment, a receiver can effectively estimate and compensate for mismatch when there is a time delay between I and Q components in a receiver having a high sampling frequency such as a broadband system by estimating mismatch by use of some bands of a received signal.

It will be apparent to those skilled in the art that various modifications can be made to the above-described exemplary embodiments of the present invention without departing from the spirit or scope of the invention. Thus, it is intended that the disclosed technology covers all such modifications provided they come within the scope of the appended claims and their equivalents.

What is claimed is:

1. A receiver comprising:
    a first mixer configured to provide an in-phase (I) component of a radio frequency (RF) signal to an I channel by down-converting the RF signal wirelessly received;
    a second mixer configured to provide a quadrature (Q) component of the RF signal to a Q channel by down-converting the RF signal;
    amplification means, arranged on the I and Q channels, configured to amplify the I and Q components;
    a mismatch estimator configured to convert the amplified I and Q components into a frequency domain, and estimate a gain mismatch value and a phase mismatch value on the basis of the converted components, and
    a mismatch compensator configured to compensate for mismatch of the amplified I and Q components on the basis of the estimated gain and phase mismatch values,
    wherein the mismatch estimator estimates a mismatch value from the converted components on the basis of a product of two value positioned symmetrically with respect to a direct current (DC) component.

2. The receiver of claim 1, wherein the mismatch estimator includes:
    a fast Fourier transform (FFT) unit configured to transform signals including the amplified I and Q components into the frequency domain;
    a gain mismatch estimator configured to estimate a gain mismatch value from the transformed signals; and
    a phase mismatch estimator configured to estimate a phase mismatch value from the transformed signals.

3. The receiver of claim 1, wherein the RF signal is an unknown signal in the receiver.

4. The receiver of claim 2, wherein the gain mismatch estimator estimates a gain mismatch value from the converted signal on the basis of a real part of a product of two values positioned symmetrically with respect to a DC component.

5. The receiver of claim 2, wherein the gain mismatch estimator multiplies the converted components by components positioned symmetrically with respect to a DC component, and estimates a gain mismatch value based on a real part of a sum of multiplication results.

6. The receiver of claim 2, wherein the phase mismatch estimator estimates a phase mismatch value from the converted signal on the basis of an imaginary part of a product of two values positioned symmetrically with respect to a DC component.

7. The receiver of claim 2, wherein the phase mismatch estimator multiplies the converted components by components positioned symmetrically with respect to a DC component, and estimates a phase mismatch value based on an imaginary part of a sum of multiplication results.

8. The receiver of claim 2, wherein the gain mismatch estimator derives the gain mismatch value according to $$\varepsilon = \frac{2}{X^2} \text{Re}\{R[\tau] \cdot R[-\tau]\},$$

where ε is the gain mismatch value, X is a magnitude of a transmitted signal, which is a baseband signal, and R[τ] and R[−τ] are signals obtained by transforming the signals including the amplified I and Q components into the frequency domain.

9. The receiver of claim 8, wherein the phase mismatch estimator derives the phase mismatch value according to $$\theta = \sin^{-1}\left(\frac{2}{X^2} \cdot \left(\frac{1}{1 - \frac{\varepsilon^2}{4}}\right) \cdot \text{Im}\{R[\tau] \cdot R[-\tau]\}\right),$$

where θ is the phase mismatch value.

10. The receiver of claim 8 wherein the phase mismatch estimator derives the phase mismatch value by $$\theta \approx \frac{2}{X^2} \text{Im}\{R[\tau] \cdot R[-\tau]\},$$

where θ is the phase mismatch value.

11. The receiver comprising:
a first mixer configured to provide an in-phase (I) component of a radio frequency (RF) signal to an I channel by down-converting the RF signal wirelessly received;
a second mixer configured to provide a quadrature (Q) component of the RF signal to a Q channel by down-converting the RF signal;
amplification means, arranged on the I and Q channels, configured to amplify the I and Q components;
a mismatch estimator configured to convert the amplified I and Q components into a frequency domain, and estimate a gain mismatch value and a phase mismatch value on the basis of the converted components, and
a mismatch compensator configured to compensate for mismatch of the amplified I and Q components on the basis of the estimated gain and phase mismatch values,
wherein the mismatch estimator includes:
a fast Fourier transform (FFT) unit configured to transform signals including the amplified I and Q components into the frequency domain;
a gain mismatch estimator configured to estimate a gain mismatch value from the transformed signals; and
a phrase mismatch estimator configured to estimate a phase mismatch value from the transformed signals, and
wherein, if signals input to the mixers correspond to arbitrary modulation signals,
the gain mismatch estimator derives the gain mismatch value according to $$\varepsilon = \frac{2}{P}\text{Re}\left\{\sum_{\tau=1}^{\frac{N}{2}-1} R[-\tau] \cdot R[\tau]\right\},$$

and
the phase mismatch estimator derives the phase mismatch value according to $$\theta = \sin^{-1}\left(\frac{2}{P} \cdot \left(\frac{1}{1 - \frac{\varepsilon^2}{4}}\right) \cdot \text{Im}\left\{\sum_{\tau=1}^{\frac{N}{2}-1} R[-\tau] \cdot R[\tau]\right\}\right),$$

where ε is the gain mismatch value, θ is the phase mismatch value, N is the total number of carriers, $r_\tau$ is a value output in a τ-th carrier position after the FFT, $$\sum_{\tau=1}^{\frac{N}{2}-1} (|r_\tau|^2 + |r_{-\tau}|^2) = P,$$

and R[τ] and R[−τ] are signals obtained by transforming the signals including the amplified I and Q components into the frequency domain.

12. The receiver of claim 2, wherein if signals input to the mixers correspond to arbitrary modulation signals,
the gain mismatch estimator derives the gain mismatch value according to $$\varepsilon = \frac{2}{P}\text{Re}\left\{\sum_{\tau=1}^{\frac{N}{2}-1} R[-\tau] \cdot R[\tau]\right\},$$

and
the phase mismatch estimator derives the phase mismatch value according to $$\theta \approx \frac{2}{P} \cdot \text{Im}\left\{\sum_{\tau=1}^{\frac{N}{2}-1} R[-\tau] \cdot R[\tau]\right\},$$

where ε is the gain mismatch value, θ is the phase mismatch value, N is the total number of carriers, $r_\tau$ is a value output in a τ-th carrier position after the FFT, $$\sum_{\tau=1}^{\frac{N}{2}-1} (|r_\tau|^2 + |r_{-\tau}|^2) = P,$$

and R[τ] and R[−τ] are signals obtained by transforming the signals including the amplified I and Q components into the frequency domain.

13. The receiver of claim 2, wherein the mismatch estimator estimates the gain mismatch value and the phase mismatch value by use of some bands of the signals transformed into the frequency domain.

14. A receiver comprising:
a first mixer configured to provide an in-phase (I) component of a radio frequency (RF) signal to an I channel by down-converting the RF signal wirelessly received;
a second mixer configured to provide a quadrature (Q) component of the RF signal to a Q channel by down-converting the RF signal;

amplification means, arranged on the I and Q channels, configured to amplify the I and Q components;
a mismatch estimator configured to convert the amplified I and Q components into a frequency domain, and estimate a gain mismatch value and a phase mismatch value on the basis of the converted components;
a mismatch compensator configured to compensate for mismatch of the amplified I and Q components on the basis of the estimated gain and phase mismatch values,
wherein the mismatch estimator includes:
a fast Fourier transform (FFT) unit configured to transform signals including the amplified I and Q components into the frequency domain;
a gain mismatch estimator configured to estimate a gain mismatch value from the transformed signals; and
a phase mismatch estimator configured to estimate a phase mismatch value from the transformed signals,
wherein the mismatch estimator estimates the gain mismatch value and the phase mismatch value by use of some bands of the signals transformed into the frequency domain,
wherein the gain mismatch estimator estimates the gain mismatch value according to $$\varepsilon = \frac{2}{P_I} \mathrm{Re}\left\{\sum_{\tau=a}^{b} R[-\tau] \cdot R[\tau]\right\},$$

where $\epsilon$ is the gain mismatch value, $\theta$ is the phase mismatch value, N is the total number of carriers, $$P' = \sum_{\tau=a}^{b} (|r_\tau|^2 + |r_{-\tau}|^2),$$

and $R[\tau]$ and $R[-\tau]$ are signals obtained by transforming the signals including the amplified I and Q components into the frequency domain.

15. The receiver of claim 14, wherein the phase mismatch estimator derives the phase mismatch value according to $$\theta = \sin^{-1}\left(\frac{2}{P_I} \cdot \left(\frac{1}{1-\frac{\varepsilon^2}{4}}\right) \cdot \mathrm{Im}\left\{\sum_{\tau=a}^{b} R[-\tau] \cdot R[\tau]\right\}\right),$$

where $\theta$ is the phase mismatch value.

16. The receiver of claim 14, wherein the phase mismatch estimator derives the phase mismatch value according to $$\theta \approx \frac{2}{P_I} \cdot \mathrm{Im}\left\{\sum_{\tau=a}^{b} R[-\tau] \cdot R[\tau]\right\}.$$

17. A receiver using a direct conversion method, comprising:
a mismatch estimator configured to transform signals including I and Q components of a received signal into frequency domain values, and estimate a gain mismatch value and a phase mismatch value on the basis of the frequency domain values;
a mismatch compensator configured to compensate for gain mismatch and phase mismatch of the received signal on the basis of the estimated gain and phase mismatch values,
wherein the mismatch estimator includes:
an FFT unit configured to transform the signals including the I and Q components of the received signal into the frequency domain values; and
first multipliers configured to multiply the frequency domain values by values positioned symmetrically with respect to a direct current (DC) component;
a summer configured to sum outputs of the first multipliers;
a second multiplier configured to derive the gain mismatch value by multiplying a real part of an output of the summer by a preset value; and
a third multiplier configured to multiply an imaginary part of the output of the summer by a preset value.

18. The receiver of claim 17, wherein the mismatch estimator includes:
an amplifier configured to reduce the derived gain mismatch value by ½;
a squarer configured to square an output of the amplifier;
a subtractor configured to subtract an output of the squarer from a constant "1";
a reciprocal output unit configured to output a reciprocal of an output of the subtractor;
a fourth multiplier configured to multiply an output of the reciprocal output unit by an output of the third multiplier; and
an arcsin operator configured to derive the phase mismatch value by carrying out an arcsin operation on an output of the fourth multiplier.

19. The receiver of claim 17, wherein the mismatch estimator includes:
the first multipliers, configured to multiply values corresponding to some bands among the frequency domain values by values positioned symmetrically with respect to a DC component;
an amplifier configured to reduce the derived gain mismatch value by ½;
a squarer configured to square an output of the amplifier;
a subtractor configured to subtract an output of the squarer from a constant "1";
a reciprocal output unit configured to output a reciprocal of an output of the subtractor;
a fourth multiplier configured to multiply an output of the reciprocal output unit by an output of the third multiplier; and
an arcsin operator configured to derive the phase mismatch value by carrying out an arcsin operation on an output of the fourth multiplier.

20. The receiver of claim 17, wherein the mismatch estimator includes:
the first multipliers, configured to multiply values corresponding to some bands among the frequency domain values by values positioned symmetrically with respect to a DC component.

21. The receiver of claim 17, wherein the mismatch compensator includes:
a first operator configured to output a phase mismatch compensation value by carrying out a tan(−θ) operation from the phase mismatch value θ;
a first multiplier of the first multipliers configured to multiply an output of the first operator by the I component of the received signal;
a second operator configured to output a gain mismatch compensation value by carrying out an operation of (2+ϵ)/(2−ϵ) from the gain mismatch value ϵ;

a second multiplier of the first multipliers configured to multiply an output of the second operator by the Q component of the received signal;
a first adder configured to output a mismatch-compensated Q component by adding an output of the second multiplier to an output of the first multiplier;
a third multiplier of the first multipliers configured to multiply the output of the second multiplier by the output of the first operator; and
a second adder configured to output a mismatch-compensated I component by adding an output of the third multiplier to the I component of the received signal.

* * * * *